US012617670B2

(12) United States Patent
Deng et al.

(10) Patent No.: US 12,617,670 B2
(45) Date of Patent: May 5, 2026

(54) MEMS BUMP STOPPER SURFACE FEATURES

(71) Applicant: Knowles Electronics, LLC, Itasca, IL (US)

(72) Inventors: Ken Deng, Schaumburg, IL (US); Bing Yu, Elk Grove Village, IL (US); Michael Pedersen, Long Grove, IL (US); Nicholas Palcheck, Roselle, IL (US); Jeremy Johnson, Glen Ellyn, IL (US); Richard Li-Chen Chen, Zhubei (TW)

(73) Assignee: Knowles Electronics, LLC, Itasca, IL (US)

( * ) Notice: Subject to any disclaimer, the term of this patent is extended or adjusted under 35 U.S.C. 154(b) by 497 days.

(21) Appl. No.: 18/087,602

(22) Filed: Dec. 22, 2022

(65) Prior Publication Data

US 2024/0208800 A1     Jun. 27, 2024

(51) Int. Cl.
B81B 3/00          (2006.01)
B81C 1/00          (2006.01)
(52) U.S. Cl.
CPC ........ B81B 3/0013 (2013.01); B81C 1/00111 (2013.01); B81B 2201/02 (2013.01); B81B
2203/0361 (2013.01); *B81B 2203/0376* (2013.01); *B81C 2201/0174* (2013.01)
(58) Field of Classification Search
CPC ... B81B 3/0013; B81B 3/001; B81B 2201/02; B81B 2203/0361; B81B 2203/0376; B81C 1/00111; B81C 2201/0174
See application file for complete search history.

(56) References Cited

U.S. PATENT DOCUMENTS

2017/0210612 A1* 7/2017 Chen ........................ B81B 3/001
2019/0062153 A1* 2/2019 Tseng .................. B81C 1/00531

* cited by examiner

*Primary Examiner* — Moazzam Hossain
(74) *Attorney, Agent, or Firm* — Flener IP & Business Law

(57) ABSTRACT

A microelectromechanical system (MEMS) sensor assembly comprises a substrate, a bump stopper extending from the substrate, and a sensor suspended relative to the substrate. The sensor is configured to move relative to the substrate, wherein the bump stopper is configured to restrain the sensor travel distance and prevent contact between the sensor and the substrate. The bump stopper has a surface facing the sensor, wherein an area of contact between the sensor and the surface is less than the total area of the surface.

9 Claims, 9 Drawing Sheets

MEMS BUMP STOPPER SURFACE FEATURES

FIELD OF THE DISCLOSURE

The present disclosure relates to microelectromechanical systems (MEMS) bump stoppers, and more particularly to MEMS bump stoppers having features that reduce contact surface area resulting in a reduced stiction force upon contact.

BACKGROUND

Bump stoppers are an effective way to prevent damage to MEMS devices under high dynamic loads. However, stiction upon contact between the bump stoppers and contacted components can be problematic as a major failure mode in MEMS devices. Because the force of stiction between surfaces is proportional to contact area, reducing the cross-sectional size of the bump stoppers can effectively lower the stiction force. However, a smaller sized bump stopper results in a smaller bonding area between the bump stopper and a substrate, which can compromise the bonding strength of the bump stoppers, making them vulnerable to failures including debonding, breakage, and sinking into the substrate underneath.

DRAWINGS

The foregoing and other features of the present disclosure will become more fully apparent from the following description and appended claims, taken in conjunction with the accompanying drawings. These drawings depict only several embodiments in accordance with the disclosure and are, therefore, not to be considered limiting of its scope.

DETAILED DESCRIPTION

Figure 1:
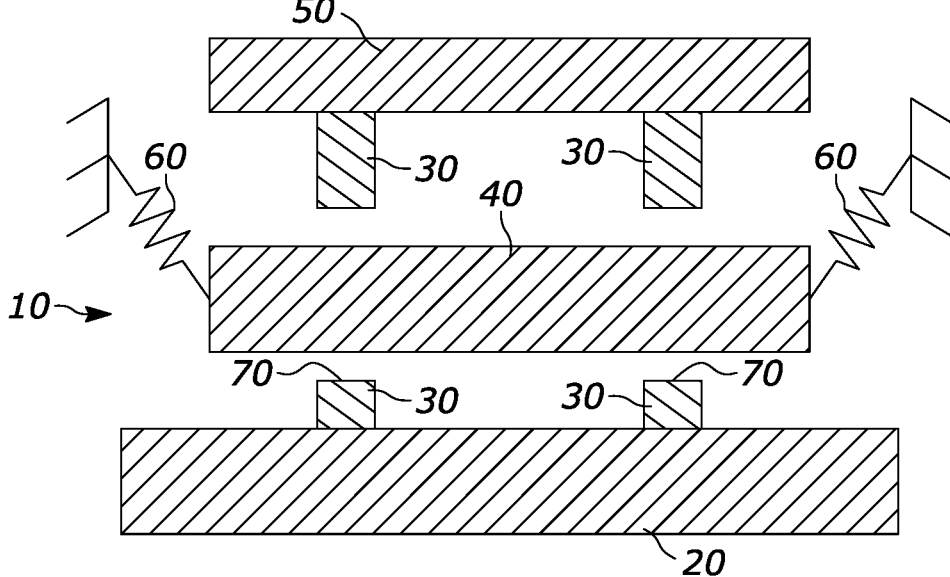
FIG. 1 illustrates a schematic cross-sectional view of an exemplary MEMS sensor assembly according to an embodiment.
Figure 2:
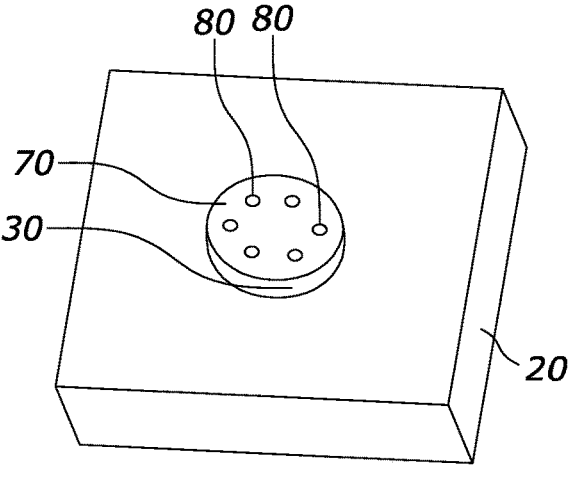
FIG. 2 is an exemplary bump stopper according to an embodiment.
Figure 3:
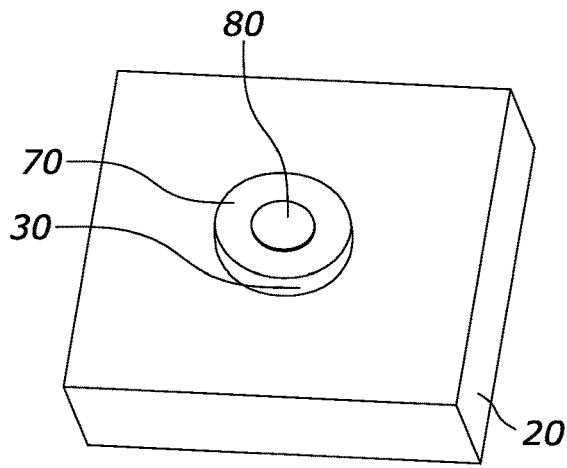
FIG. 3 is an exemplary bump stopper according to another embodiment.
Figure 4:
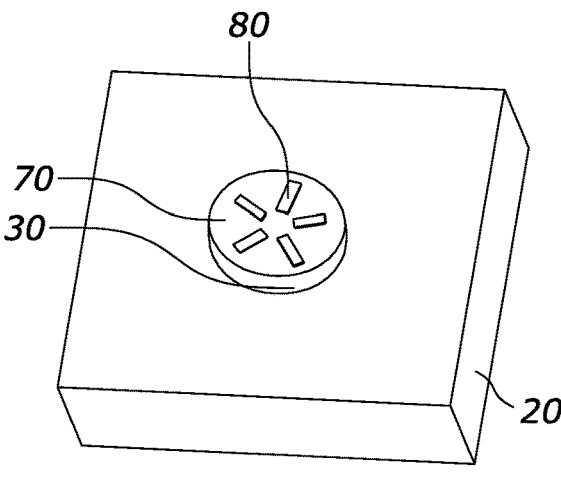
FIG. 4 is an exemplary bump stopper according to a further embodiment.
Figure 5:
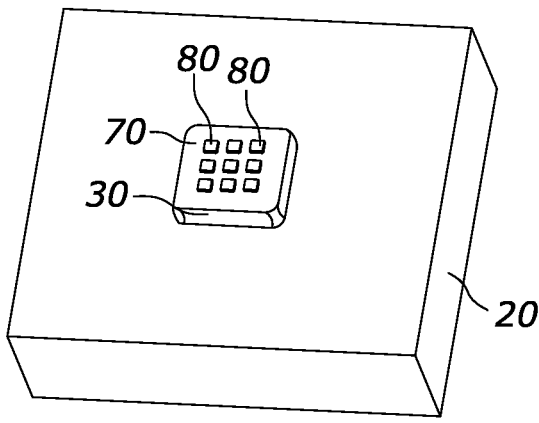
FIG. 5 is an exemplary bump stopper according to yet another embodiment.
Figure 6:
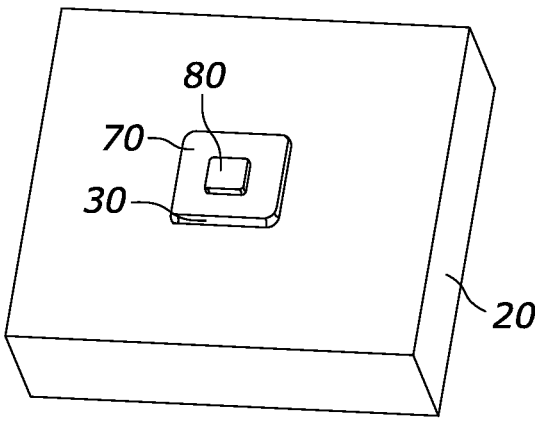
FIG. 6 is an exemplary bump stopper according to a still further embodiment.
Figure 7:
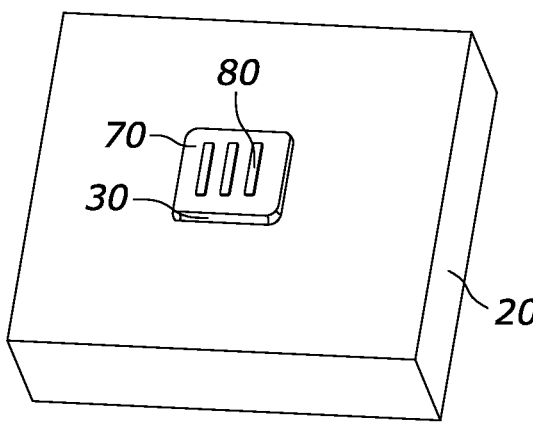
FIG. 7 is an exemplary bump stopper according to still another embodiment.

According to an embodiment, a MEMS sensor assembly comprises a substrate, a bump stopper extending from the substrate, and a sensor suspended relative to the substrate. The sensor is configured to move relative to the substrate, wherein the bump stopper is configured to restrain the sensor travel distance and prevent contact between the sensor and the substrate. The bump stopper has a surface facing the sensor, wherein an area of contact between the sensor and the surface is less than the total area of the surface. In an embodiment the surface is convex. In an embodiment the surface is concave. In an embodiment the surface includes one or more regions that protrude toward the sensor relative to the rest of the surface. In an embodiment the one or more regions have a protrusion distance in a range between about 10 nm and about 400 nm.

According to some embodiments the bump stopper has a plan view shape selected from the group of shapes consisting of an oval, an ellipse, a rectangle, a rectangle having rounded corners, and combinations thereof. According to some embodiments the one or more regions have a plan view shape selected from the group of shapes consisting of an oval, an ellipse, a rectangle, a rectangle having rounded corners, and combinations thereof.

In an embodiment, a process for manufacturing a bump stop for a MEMS sensor comprises the steps of providing a substrate having a surface, depositing a first material onto a first portion of the surface, depositing a second material onto the first material and the rest of the surface, polishing the first and second materials to create a planar surface on the first material and one or more recesses in the second material relative to the planar surface, and depositing bump stop material over regions of the planar surface and the one or more recesses. In an embodiment the bump stop material is deposited onto a first region of the planar surface and a second region of a recess at least partially surrounded by the first region. In an embodiment the first region entirely surrounds the second region. In an embodiment the bump stop material is deposited onto a first region of the planar surface and a second region of a recess that at least partially surrounds the first region. In an embodiment the second region entirely surrounds the first region.

In an embodiment the bump stop material is deposited onto first and second regions of the planar surface and a third region of a recess disposed in between the first and second regions. In an embodiment the bump stop material is deposited onto first and second regions of recesses and a third region of the planar surface disposed in between the first and second regions. In an embodiment the bump stop material is deposited onto a first region of the planar surface and a second region of a recess disposed adjacent to the first region.

Bump stoppers provide protection to MEMS devices by limiting the range of travel of the MEMS components, preventing them from over stressing and breakage during mechanical dynamic loads. Unfortunately, undesirable stiction between contact surfaces of the MEMS components and the bump stoppers can result during such dynamic loads.

Stiction severely compromises the reliability of, and is a major failure mode in MEMS devices.

Stiction force originates from an attraction force between molecules, called the van der Waals force (FvdW), on the interacting surfaces. FvdW is directly proportional to contact area: $F_{vdW} \propto A_{contact}$. Thus, reducing the size of a bump stopper contact surface effectively reduces the stiction force associated with the bump stopper. Described herein are various embodiments of MEMS bump stoppers that demonstrate robustness while reducing the problem of stiction by having reduced effective contact surface areas.

Referring to FIG. 1, in an embodiment a MEMS sensor assembly 10 comprises a substrate 20, one or more bump stoppers 30 each extending at a first end of the bump stopper 30 from the substrate 20, and a sensor 40 suspended relative to the substrate 20. In an embodiment the MEMS sensor assembly 10 optionally includes a cap 50. The sensor 40 illustrated in FIG. 1 is schematically shown to be suspended relative to the substrate 20 by springs 60; however, in various embodiments the sensor 40 can be suspended by springs or other structural members around its entire periphery or from a single point or region, and/or can be attached to the substrate 20 or another component within the MEMS sensor assembly 10 directly or via other intervening components. In an embodiment the sensor 40 is configured to move relative to the substrate 20, and the one or more bump stoppers 30 are configured to restrain the sensor 40 travel distance and prevent contact between the sensor 40 and the substrate 20. In an embodiment each of the one or more bump stoppers 30 has a surface 70 facing the sensor 40 on a second end distal from the substrate 20. In an embodiment an area of contact between the sensor 40 and the surface 70 is less than the total area of the surface 70.

Referring to FIGS. 2-7, several exemplary embodiments of bump stoppers 30 are each shown disposed on a substrate 20. In an embodiment the one or more bump stoppers 30 each have a plan view shape selected from the group of shapes consisting of an oval, an ellipse, a rectangle, a rectangle having rounded corners, and combinations thereof. The surface 70 on each of the bump stoppers 30 includes one or more regions 80 that protrude toward the sensor 40 relative to the rest of the surface 70. The one or more regions 80 effectively reduce the contact area when a MEMS component, for example the sensor 40, makes contact with them. Consequently, the stiction force between the bump stoppers 30 and the contacting MEMS component is reduced, thereby inhibiting stiction failure. In the exemplary embodiments illustrated in FIGS. 2-7, the one or more regions 80 have a plan view shape selected from the group of shapes consisting of an oval, an ellipse, a rectangle, a rectangle having rounded corners, and combinations thereof.

Figure 8:
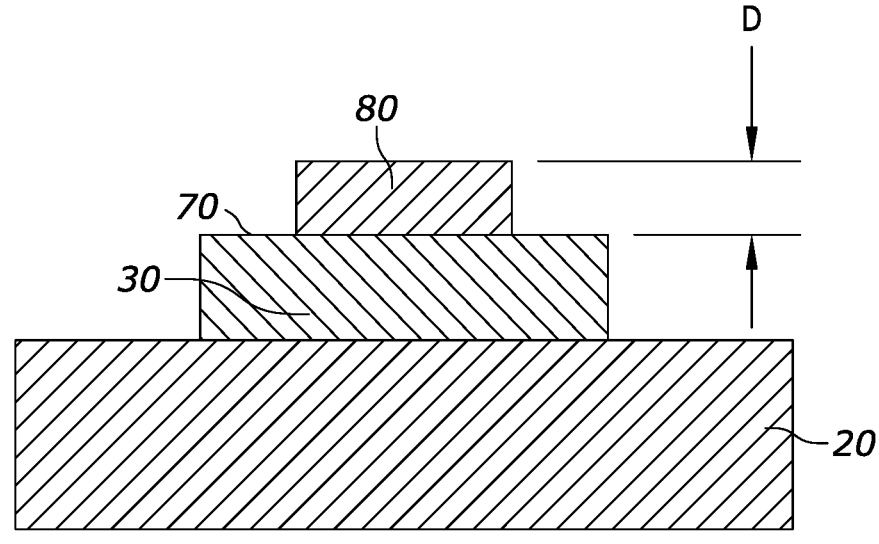
FIG. 8 is a schematic cross sectional view of an exemplary bump stopper according to an embodiment.

In an embodiment, as illustrated in FIG. 8, the one or more regions 80 have a protrusion distance, D. In an embodiment the protrusion distance D is a range between about 10 nm and about 400 nm. In another embodiment the protrusion distance D is a range between about 10 nm and about 200 nm. In a further embodiment the protrusion distance D is a range between about 10 nm and about 100 nm. In some embodiments the one or more regions 80 are built up or etched out by MEMS fabrication processes. Without being held to theory, the protrusion distance D is in a range that does not compromise the contact surface strength of the bump stopper 30.

Figure 9:
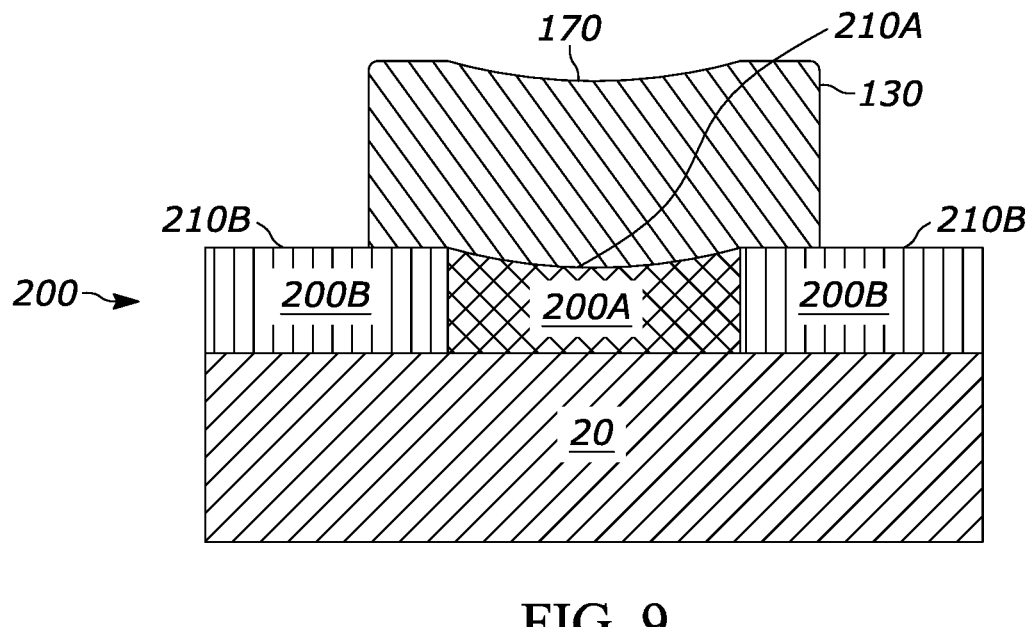
FIG. 9 is a schematic cross sectional view of an exemplary bump stopper according to another embodiment.
Figure 10:
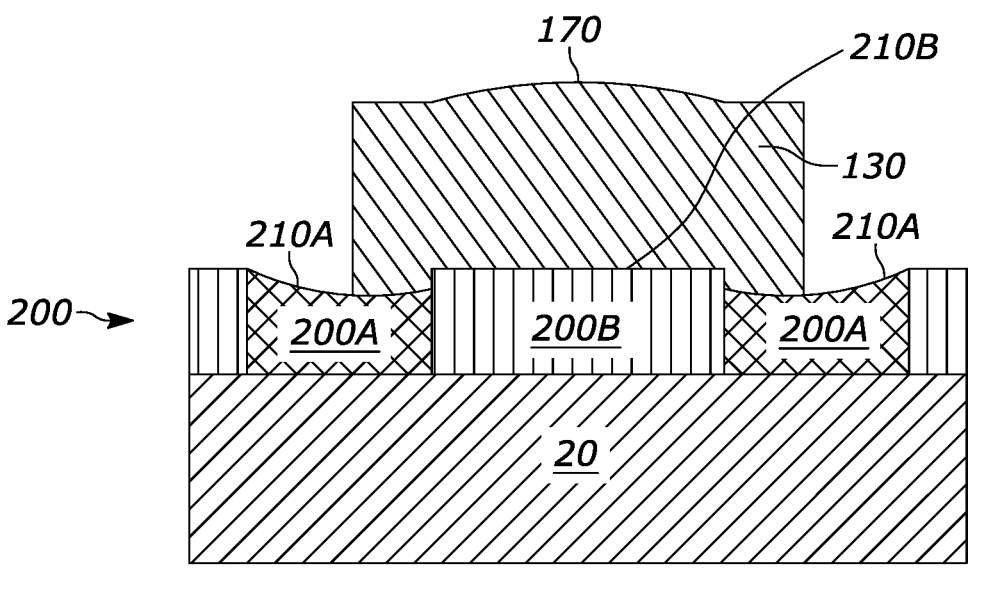
FIG. 10 is a schematic cross sectional view of an exemplary bump stopper according to a further embodiment.

In an embodiment, referring to FIGS. 9 and 10, MEMS processes are utilized to form a curved or uneven surface 170 on a free end of a bump stopper 130. For example, during MEMS fabrication chemical mechanical polishing (CMP) is often utilized to make a planar surface on a top layer of material 200 before adding a subsequent layer of material. When CMP is applied to a surface having multiple materials side by side, a physical phenomenon known as "dishing" causes a portion of the softer or less resistant material 200A to be recessed relative to the harder or more resistant material 200B. In an embodiment, the resulting non-flat surface can be productively used to create a curved or uneven surface 170 on the free end of the bump stopper 130.

Referring to FIG. 9, in an embodiment the material 200 disposed on the substrate 20 includes a softer material 200A and a harder material 200B. Application of CMP to the surfaces of materials 200A and 200B results in a planar surface 210B on the material 200B and a recess 210A in the material 200A relative to the planar surface 210B. In a subsequent step, material making up the bump stop 130 is applied over regions of the planar surface 210B and the recess 210A.

Figure 11:
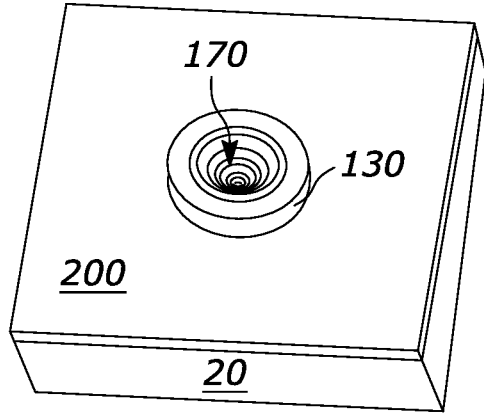
FIG. 11 is perspective view of the exemplary bump stopper illustrated in FIG. 9.

In an embodiment, the region of the planar surface 210B onto which the bump stop material is deposited entirely surrounds the region of the recess 210A, so that the resulting surface 170 on the free end of the bump stopper 130 is a concave surface as illustrated in FIG. 11. In an embodiment the region of the planar surface 210B onto which the bump stop material is deposited partially surrounds the region of the recess 210A, so that the resulting surface 170 on the free end of the bump stopper 130 has a lower recessed portion that is partially surrounded by a higher peripheral portion.

Figure 12:
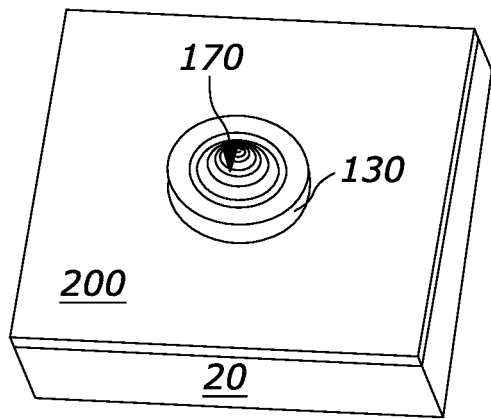
FIG. 12 is perspective view of the exemplary bump stopper illustrated in FIG. 10.

Referring to FIG. 10, in an embodiment the region of the recess 210A onto which the bump stop material is deposited entirely surrounds the region of the planar surface 210B, so that the resulting surface 170 on the free end of the bump stopper 130 is a convex surface as illustrated in FIG. 12. In an embodiment the region of the recess 210A onto which the bump stop material is deposited partially surrounds the region of the planar surface 210B, so that the resulting surface 170 on the free end of the bump stopper 130 has a raised convex portion that is partially surrounded by a lower peripheral portion.

Figures 13, 14:
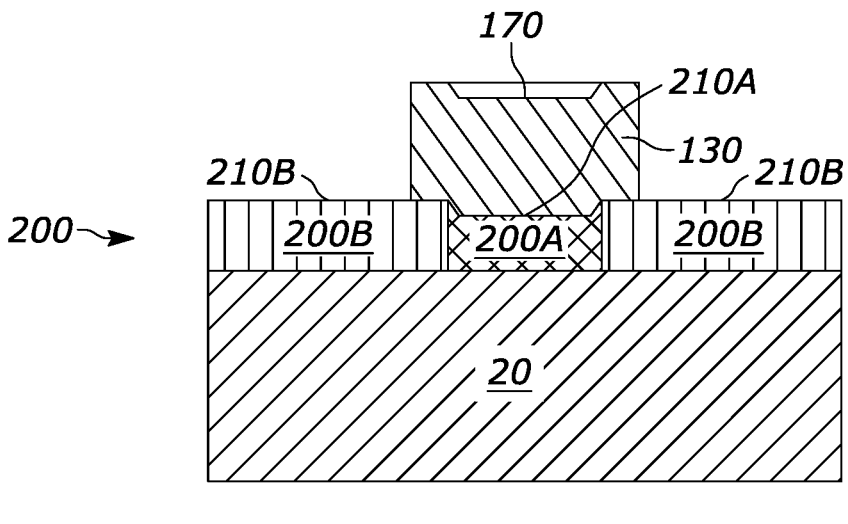
FIG. 13 is a schematic cross sectional view of an exemplary bump stopper according to yet another embodiment.
FIG. 14 is a schematic cross sectional view of an exemplary bump stopper according to yet a further embodiment.
Figure 15:
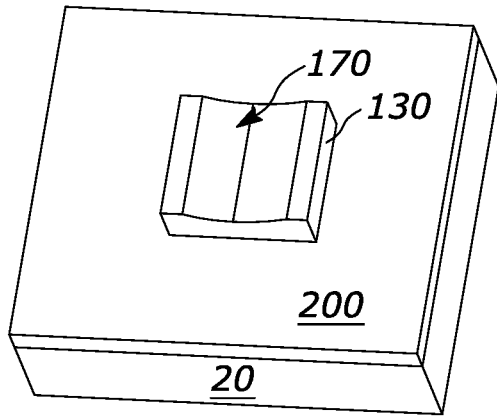
FIG. 15 is perspective view of the exemplary bump stopper illustrated in FIG. 13.

Referring to FIG. 13, in an embodiment the bump stop material is deposited onto first and second regions of the planar surface 210B and a third region of a recess 210A disposed in between the first and second regions of the planar surface 210B, so that the resulting surface 170 on the free end of the bump stopper 130 has a lower recessed central portion and a higher portion on either side of the lower recessed central portion, as illustrated in FIG. 15.

Figure 16:
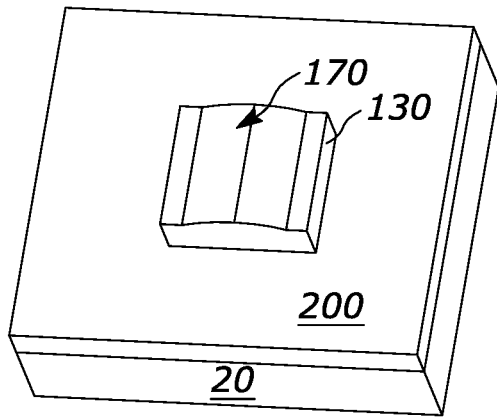
FIG. 16 is perspective view of the exemplary bump stopper illustrated in FIG. 14.

Referring to FIG. 14, in an embodiment the bump stop material is deposited onto first and second regions of a recess 210A and a third region of the planar surface 210B disposed in between the first and second regions of the recess 210A, so that the resulting surface 170 on the free end of the bump stopper 130 has a higher central portion and a lower portion on either side of the higher central portion, as illustrated in FIG. 16.

Figure 17:
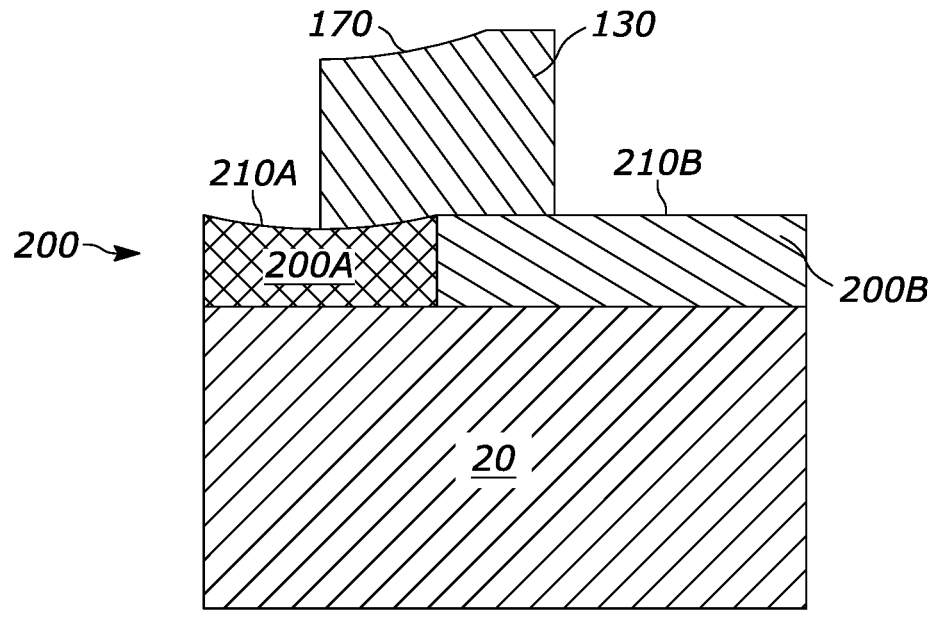
FIG. 17 is a schematic cross sectional view of an exemplary bump stopper according to yet a further embodiment.
Figure 18:
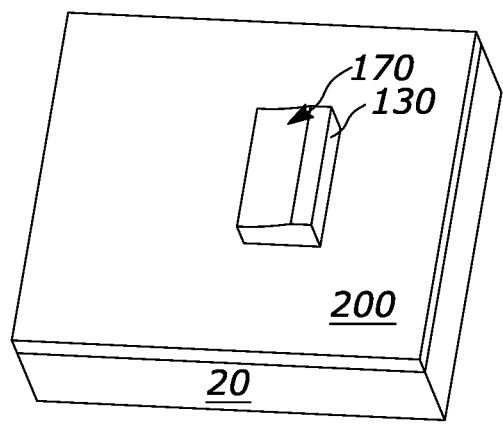
FIG. 18 is perspective view of the exemplary bump stopper illustrated in FIG. 17.

Referring to FIG. 17, in an embodiment the bump stop material is deposited onto a first region of the planar surface 210B and a second region of a recess 210A disposed adjacent to the first region of the planar surface 210B, so that the resulting surface 170 on the free end of the bump stopper 130 has lower side adjacent to a higher side, as illustrated in FIG. 18. The bump stoppers 130 illustrated in FIGS. 9-18 have circular or rectangular shapes; however, there is no limitation on the shape of the bump stoppers 130 that can be created by application of the bump stop material over one or more regions of the planar surface 210B and/or a recess 210A as has been described hereinabove. The resulting surfaces 170 illustrated in FIGS. 9-18 effectively reduce the contact area when a MEMS component, for example the sensor 40, makes contact with them. Consequently, the stiction force between the bump stoppers 130 and the contacting MEMS component is reduced, thereby inhibiting stiction failure.

In an embodiment, materials used for the substrate 20 can, for example without limitation, include silicon, glass, gallium arsenide (GaAs), and polysilicon. In an embodiment, materials used for the softer material 200A and the harder material 200B, that can be applied onto the substrate 20 or that can alternately be part of the substrate 20 can, for example without limitation, include silicon dioxide ($SiO_2$), tetraethyl orthosilicate (TEOS), silicon nitride (SiN), silicon oxynitride (SiON), polysilicon, copper, tungsten, and metal or other metal compounds. In an embodiment, materials used for the bump stoppers 30, 130 can, for example without limitation, include silicon dioxide ($SiO_2$), tetraethyl orthosilicate (TEOS), silicon nitride (SiN), silicon oxynitride (SiON), polysilicon, copper, tungsten, and metal or other metal compounds. In an embodiment, the one or more regions 80 that protrude from the surface 70 can, for example without limitation, include silicon dioxide ($SiO_2$), tetraethyl orthosilicate (TEOS), silicon nitride (SiN), silicon oxynitride (SiON), polysilicon, copper, tungsten, and metal or other metal compounds. In an embodiment, materials used for the sensor 40, which can be representative of a diaphragm, a spring-suspended proof mass, or other MEMS component, can, for example without limitation, include silicon, polysilicon, gallium arsenide (GaAs), silicon dioxide ($SiO_2$), tetraethyl orthosilicate (TEOS), silicon nitride (SiN), silicon oxynitride (SiON), and metal or other metal compounds.

Steps in a production process utilized to produce the any of the bump stoppers 30, 130 as described hereinabove include etching, masking, patterning, and/or cutting. All of the steps are not described in detail herein. The foregoing description of illustrative embodiments has been presented for purposes of illustration and of description. It is not intended to be exhaustive or limiting with respect to the precise form disclosed, and modifications and variations are possible in light of the above teachings or may be acquired from practice of the disclosed embodiments. It is intended that the scope of the disclosure be defined by the claims appended hereto and their equivalents.

What is claimed is:

1. A microelectromechanical system (MEMS) sensor assembly, comprising:
   a substrate;
   a bump stopper extending from the substrate; and
   a sensor suspended relative to the substrate, the sensor configured to move relative to the substrate, wherein the bump stopper is configured to restrain the sensor travel distance and prevent contact between the sensor and the substrate, the bump stopper having a surface facing the sensor;
   wherein an area of contact between the sensor and the surface is less than the total area of the surface;

wherein the surface includes a region of recess and one or more regions that protrude toward the sensor relative to the rest of the surface; and
   wherein said region of recess is curved.

2. The MEMS sensor assembly of claim 1, wherein said region of recess is convex.

3. The MEMS sensor assembly of claim 1, wherein said region of recess is concave.

4. The MEMS sensor assembly of claim 1, wherein the one or more regions have a protrusion distance in a range between about 10 nm and about 400 nm.

5. A microelectromechanical system (MEMS) sensor assembly, comprising:
   a substrate;
   a sensor suspended relative to the substrate, the sensor configured to move relative to the substrate; and
   a bump stopper extending from the substrate at a first end of the bump stopper, the bump stopper having a surface facing the sensor on a second end distal from the substrate, wherein the bump stopper is configured to restrain the sensor travel distance and prevent contact between the sensor and the substrate;
   wherein an area of contact area between the sensor and the surface is less than the total area of the surface; and
   wherein the surface includes a region of recess surrounded by one or more regions that protrude toward the sensor relative to the rest of the surface; and
   wherein said region of recess is one of concave and convex.

6. The MEMS sensor assembly of claim 5, wherein the one or more regions have a protrusion distance in a range between about 10 nm and about 400 nm.

7. The MEMS sensor assembly of claim 5, wherein the bump stopper has a plan view shape selected from the group of shapes consisting of an oval, an ellipse, a rectangle, a rectangle having rounded corners, and combinations thereof.

8. The MEMS sensor assembly of claim 7, wherein the one or more regions have a plan view shape selected from the group of shapes consisting of an oval, an ellipse, a rectangle, a rectangle having rounded corners, and combinations thereof.

9. A microelectromechanical system (MEMS) sensor assembly, comprising:
   a substrate;
   a sensor suspended relative to the substrate, the sensor configured to move relative to the substrate; and
   a bump stopper extending from the substrate at a first end of the bump stopper, the bump stopper having a surface facing the sensor on a second end distal from the substrate, wherein the bump stopper is configured to restrain the sensor travel distance and prevent contact between the sensor and the substrate;
   wherein an area of contact area between the sensor and the surface is less than the total area of the surface;
   wherein the surface includes a region of recess surrounded by one or more regions that protrude toward the sensor relative to the rest of the surface; and
   wherein said region of recess is a non-flat surface and said one or more regions that protrude are planar surfaces.

* * * * *